United States Patent
Yoshihisa et al.

(10) Patent No.: US 9,490,246 B2
(45) Date of Patent: Nov. 8, 2016

(54) SEMICONDUCTOR DEVICE

(71) Applicant: Renesas Electronics Corporation, Kawasaki-shi, Kanagawa (JP)

(72) Inventors: Yasuki Yoshihisa, Kawasaki (JP); Ryoji Matsuda, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/809,118

(22) Filed: Jul. 24, 2015

(65) Prior Publication Data
US 2016/0056149 A1 Feb. 25, 2016

(30) Foreign Application Priority Data

Aug. 25, 2014 (JP) .................................. 2014-170420

(51) Int. Cl.
*H01L 27/02* (2006.01)
*H01L 29/36* (2006.01)
*H01L 29/861* (2006.01)

(52) U.S. Cl.
CPC ....... *H01L 27/0288* (2013.01); *H01L 27/0255* (2013.01); *H01L 29/36* (2013.01); *H01L 29/8611* (2013.01)

(58) Field of Classification Search
CPC ........... H01L 27/0288; H01L 27/0255; H01L 28/20; H01L 29/0642; H01L 29/861
USPC ....................................................... 257/538
See application file for complete search history.

(56) References Cited

U.S. PATENT DOCUMENTS

| | | | | |
|---|---|---|---|---|
| 2004/0245599 A1* | 12/2004 | Kato | ....................... | H01L 23/50 257/529 |
| 2006/0049484 A1* | 3/2006 | Nomura | .................. | H01L 28/20 257/536 |
| 2006/0289963 A1* | 12/2006 | Asano | ................. | H01L 27/0605 257/506 |
| 2010/0133611 A1* | 6/2010 | Disney | ................ | H01L 29/0638 257/335 |
| 2011/0133269 A1* | 6/2011 | Yamaji | ................ | H01L 27/1203 257/328 |
| 2011/0198726 A1* | 8/2011 | Nitta | ..................... | H01L 21/761 257/552 |

FOREIGN PATENT DOCUMENTS

JP  10-74958 A  3/1998
JP  11-121768 A  4/1999

* cited by examiner

*Primary Examiner* — Fernando L Toledo
*Assistant Examiner* — Adam S Bowen
(74) *Attorney, Agent, or Firm* — McDermott Will & Emery LLP

(57) ABSTRACT

A P-type epitaxial growth layer is formed on a P-type semiconductor substrate with an N-type buried region and a P-type buried region interposed therebetween. A cathode region, an anode region, and an N-type sinker region are formed in P-type epitaxial growth layer. A resistance element is formed on a surface of an isolation region that electrically isolates anode region and N-type sinker region. Resistance element has: one end portion electrically connected to each of anode region and N-type sinker region; and the other end portion electrically connected to a ground potential.

12 Claims, 21 Drawing Sheets

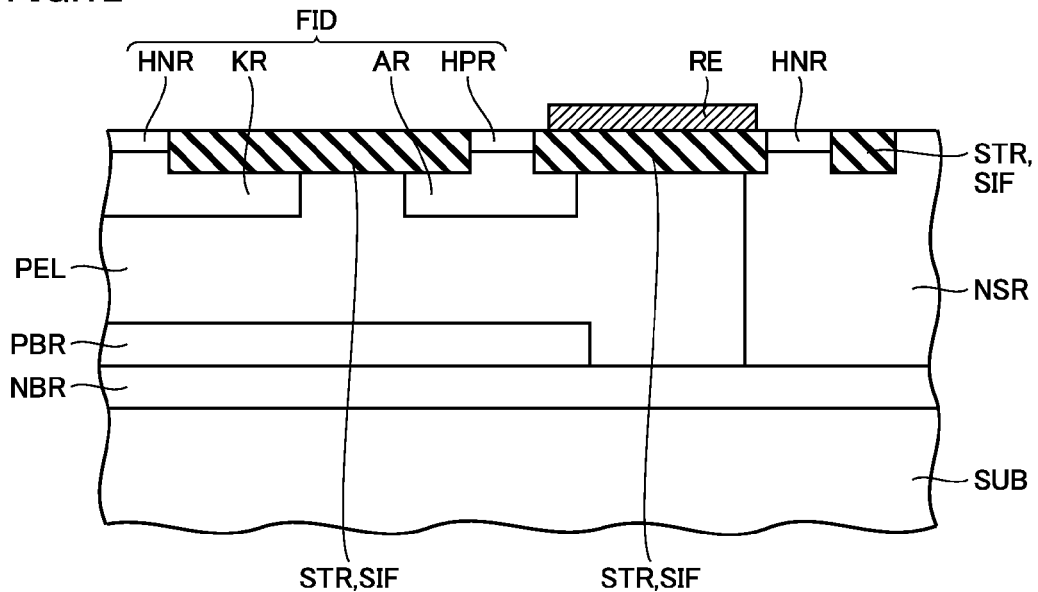
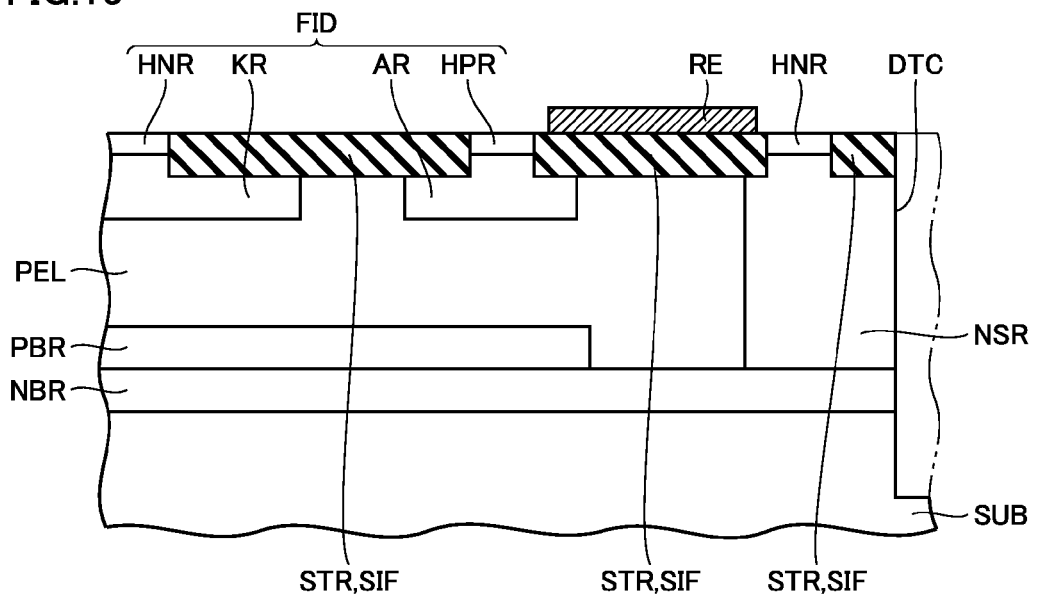

SEMICONDUCTOR DEVICE

CROSS-REFERENCE TO RELATED APPLICATIONS

This Application claims priority to Japanese Patent Application No. 2014-170420 filed Aug. 25, 2014, the subject matter of which is incorporated herein by reference in entirety.

BACKGROUND OF THE INVENTION

1. Field of the Invention

The present invention relates to a semiconductor device, and particularly, is suitably applicable to a semiconductor device including a diode as a protection element.

2. Description of the Background Art

In a semiconductor device, a protection element is formed in order to prevent a specific element from being destroyed by a surge, static electricity or the like. One of such protection elements is a diode referred to as a FID (Full Isolation Diode). This type of semiconductor device is disclosed in Japanese Patent Laying-Open Nos. 10-74958 and 11-121768.

In such a semiconductor device, a P-type epitaxial growth layer is formed on a P-type semiconductor substrate with an N-type buried region and a P-type buried region interposed therebetween. In this P-type epitaxial growth layer, a cathode region (N-type) and an anode region (P-type) are formed at a distance from each other. Also, an N-type sinker region penetrating the P-type epitaxial growth layer to the N-type buried region is formed.

In this semiconductor device including a diode, the N-type sinker region is electrically connected to the N-type buried region and electrically connected (short-circuited) to an anode region of the diode, thereby achieving an effect of suppressing a leakage current flowing from a cathode region to the semiconductor substrate.

However, when a surge or the like flows into the semiconductor device, a current resulting from such a surge may flow into both of the semiconductor substrate and the cathode region. At this time, the operation of the parasitic PNP transistor causes a current to flow from the semiconductor substrate into the anode region, and also, the current having flown into the anode region acts as a base current of the parasitic NPN transistor, so that the operation of the parasitic NPN transistor is accelerated. Consequently, a large current flows from the cathode region through the N-type buried region into the N-type sinker region, which may finally result in destruction of the diode.

Thus, in semiconductor devices, countermeasures for preventing such destruction of the diode have been taken by electrically connecting a resistance element to an anode region, thereby suppressing the operations of the parasitic PNP transistor and the parasitic NPN transistor.

SUMMARY OF THE INVENTION

The conventional semiconductor device however still poses the following problems. Specifically, a resistance element for suppressing destruction of a diode is formed, through a wire formed on an insulating film covering the diode and the like, in a region different from the region having the diode formed therein. Thereby, an additional region for arranging a resistance element is required, which is regarded as one of factors that prevent size reduction of the semiconductor device.

Other problems and new characteristics will become apparent from the description in the present specification and the accompanying drawings.

A semiconductor device according to one embodiment includes: a semiconductor substrate of a first conductivity type; an epitaxial growth layer of the first conductivity type; a first buried region of a second conductivity type; a second buried region of the first conductivity type; a first impurity region of the second conductivity type; a second impurity region of the first conductivity type; a third impurity region of the second conductivity type; and an isolation region electrically isolating the second impurity region and the third impurity region, and formed in a portion of the epitaxial growth layer. The third impurity region is electrically connected to a ground potential through a resistance element. The resistance element is formed on the isolation region.

A semiconductor device according to another embodiment includes: a semiconductor substrate of a first conductivity type; an epitaxial growth layer of the first conductivity type; a first buried region of a second conductivity type; a second buried region of the first conductivity type; a first impurity region of the second conductivity type; a second impurity region of the first conductivity type formed so as to surround the first impurity region; a third impurity region of the second conductivity type formed to extend from a surface of the epitaxial growth layer to the first buried region so as to surround the second impurity region; and an isolation region electrically isolating the second impurity region and the third impurity region, and formed along a portion of the epitaxial growth layer. The third impurity region is electrically connected to a ground potential through a resistance element. The resistance element is formed on the isolation region.

The semiconductor device according to one embodiment can contribute to size reduction of the semiconductor device.

The semiconductor device according to another embodiment can contribute to size reduction of the semiconductor device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a cross-sectional view showing a step carried out after the step shown in FIG. 11 according to the first embodiment.

FIG. 13 is a cross-sectional view showing a step carried out after the step shown in FIG. 12 according to the first embodiment.

DESCRIPTION OF THE PREFERRED EMBODIMENTS

Figure 1:
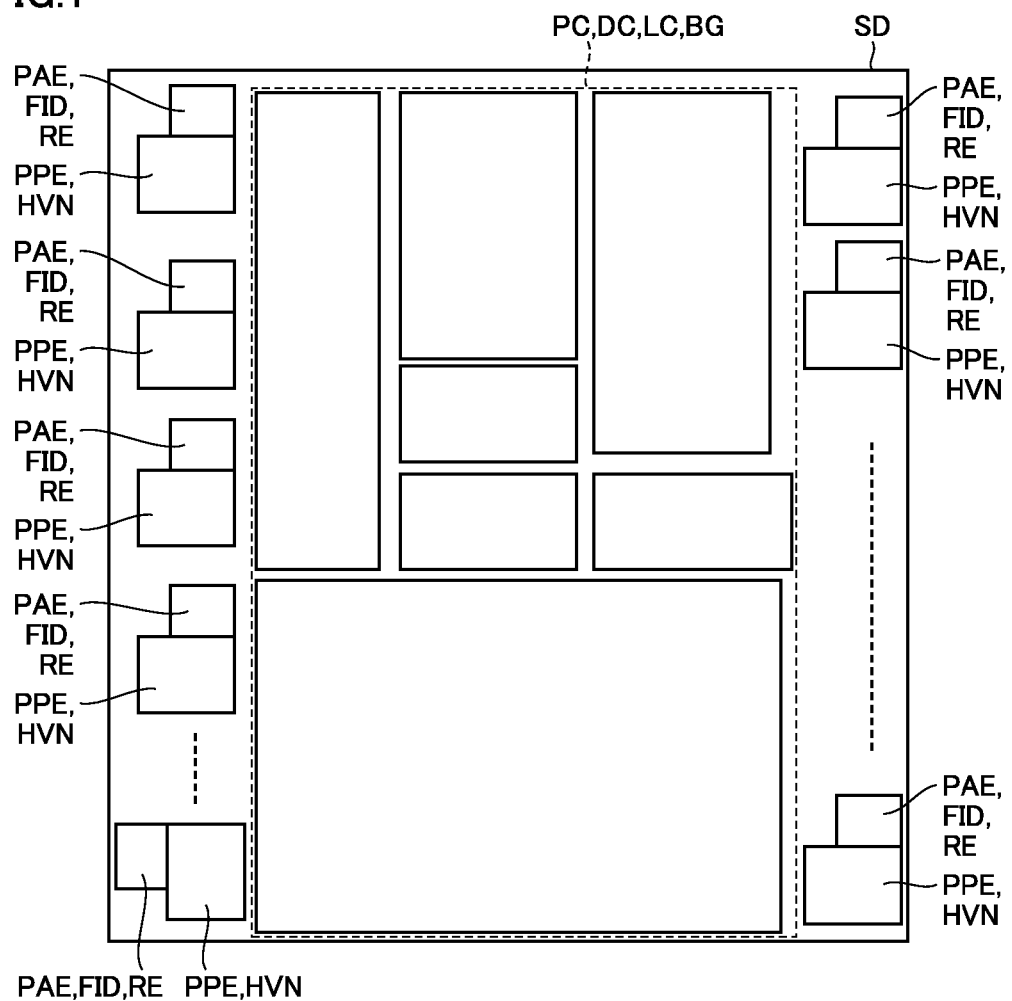
FIG. 1 is a plan view showing a planar layout of a semiconductor device according to each embodiment.

In recent years, there appears a semiconductor device in which a bipolar element, a CMOS (Complementary Metal Oxide Semiconductor) element, a DMOS (Double-Diffused MOS) element, and the like are mounted in one chip in order to accommodate multi-functionalized electronic devices. FIG. 1 shows one example of the planar structure (layout) of such a semiconductor device.

As shown in FIG. 1, in a semiconductor chip SD (semiconductor device), a power supply circuit PC, a driver circuit DC, a logic circuit LC, a BG circuit BG, and the like are arranged so as to occupy most of the portion located approximately in the center area. On the periphery of semiconductor chip SD, a high breakdown voltage N channel type MOS transistor HVN serving as a driver is arranged as one of high breakdown voltage elements, for example.

A diode FID is formed as a protection element for protecting this high breakdown voltage N channel type MOS transistor HVN from a surge, static electricity or the like. Diode FID is formed in a protection element formation region PAE arranged so as to be adjacent to a protected element formation region PPE in which high breakdown voltage N channel type MOS transistor HVN is formed.

In each embodiment described below, a specific explanation will be given with regard to the structure of protection element formation region PAE and the like in which diode FID for protecting a protected element such as high breakdown voltage N channel type MOS transistor HVN is formed.

First Embodiment

The first example of a semiconductor device including a diode protecting a protected element such as a high breakdown voltage element will be hereinafter described.

Figure 2:
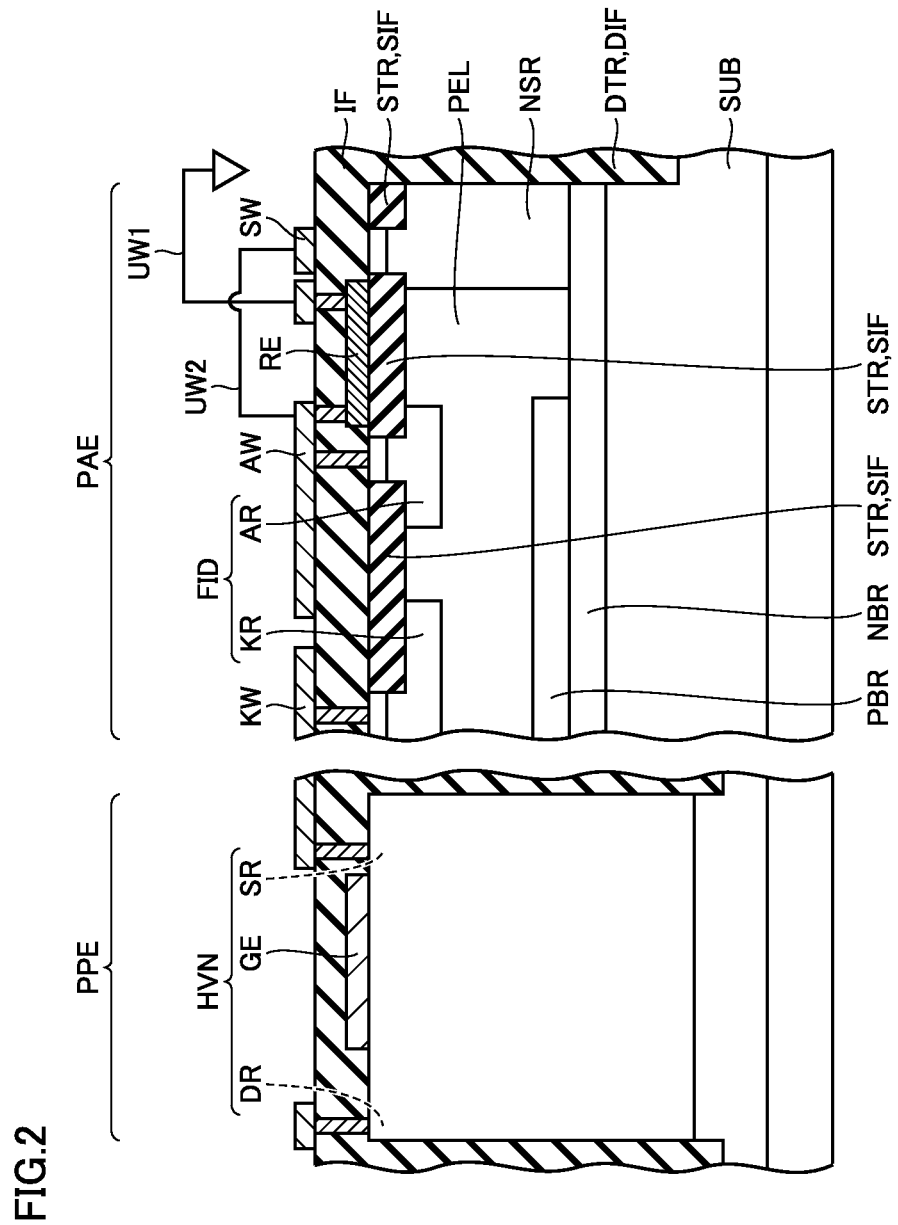
FIG. 2 is a cross-sectional view showing a protected element formation region and a protection element formation region in a semiconductor device according to the first embodiment.

As shown in FIG. 2, protected element formation region PPE and protection element formation region PAE are defined in a semiconductor substrate SUB so as to be adjacent to each other. In protected element formation region PPE, high breakdown voltage N channel type MOS transistor HVN including a gate electrode GE, a drain region DR and a source region SR is formed as one example of the protected element. Diode FID as a protection element is formed in protection element formation region PAE.

In the semiconductor device, a resistance element RE is connected between an N-type sinker region NSR and the ground potential in order to suppress destruction of diode FID by a current flowing from semiconductor substrate SUB and a current flowing from a cathode region KR in association with a surge and the like. This resistance element RE is arranged in an isolation region STR that electrically isolates N-type sinker region NSR and an anode region AR.

Then, the structure of protection element formation region PAE having diode FID formed therein in the semiconductor device will be hereinafter described in detail.

Figure 3:
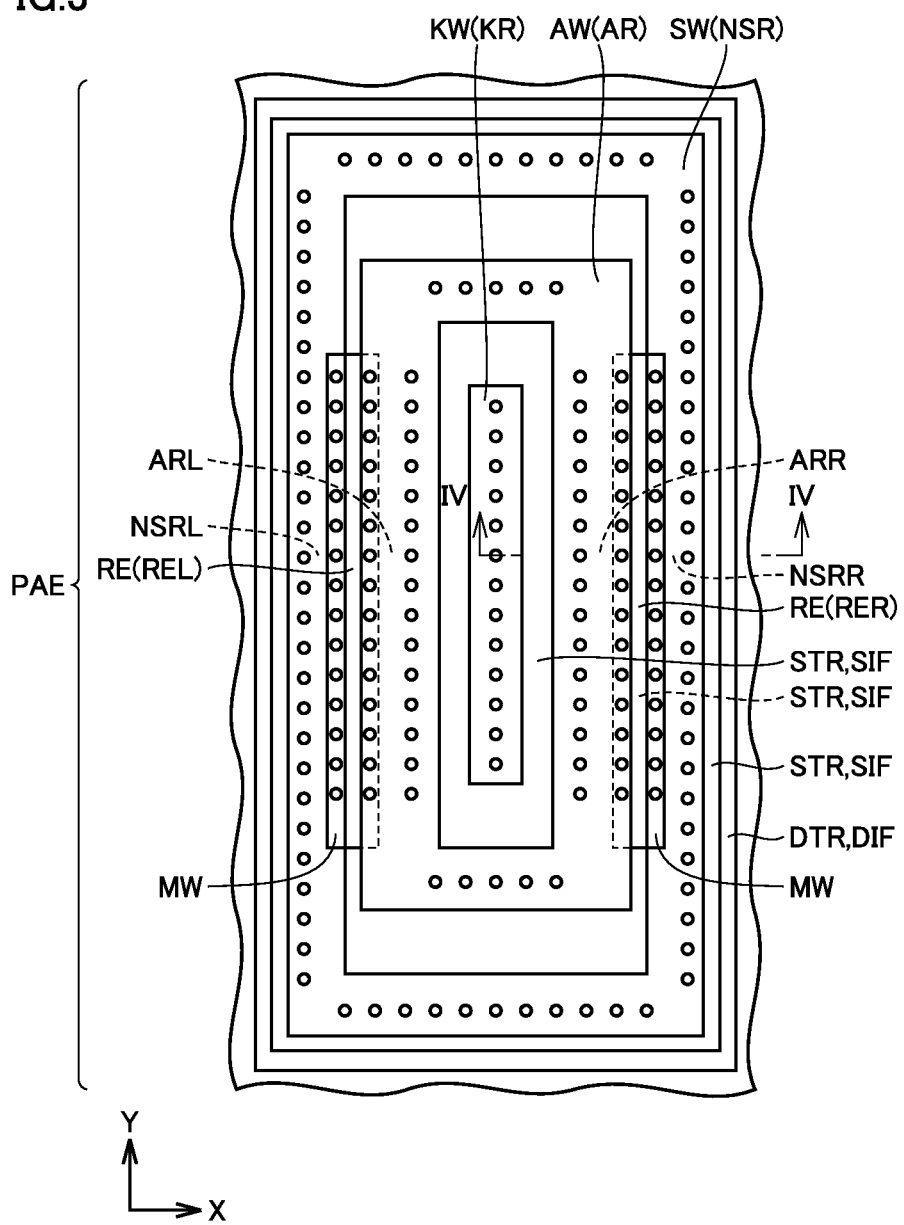
FIG. 3 is a plan view showing a planar structure of the protection element formation region according to the first embodiment.
Figure 4:
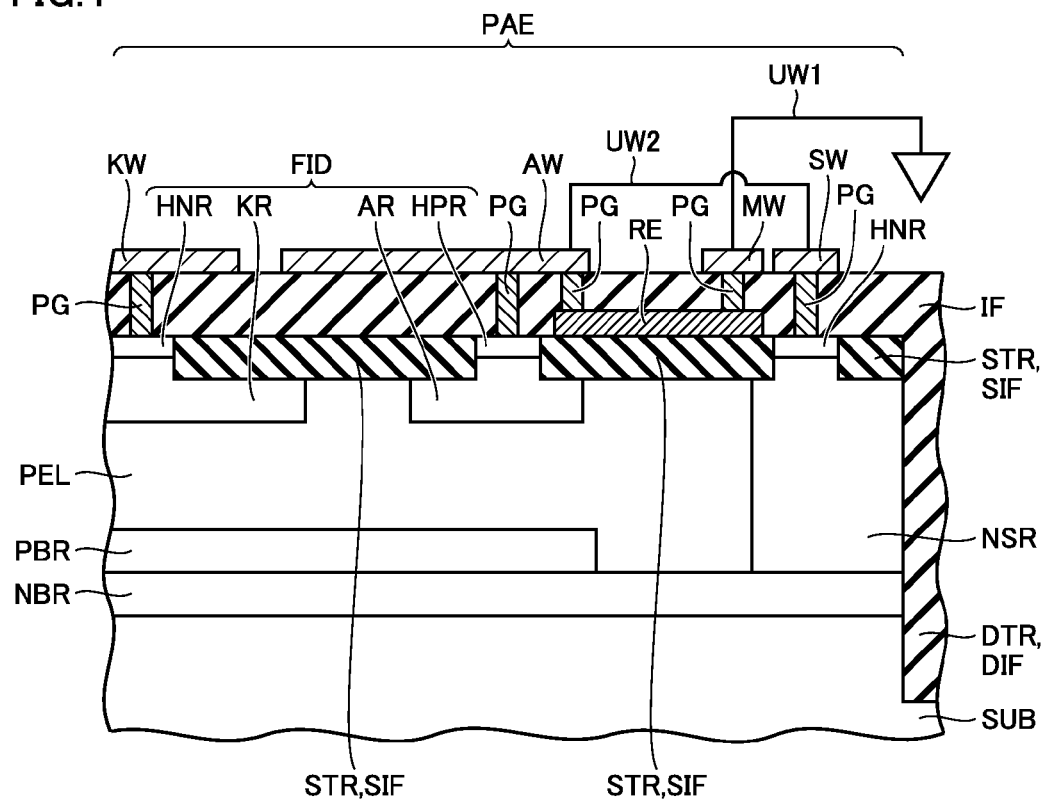
FIG. 4 is a cross-sectional view taken along a section line IV-IV shown in FIG. 3 according to the first embodiment.

As shown in FIGS. 3 and 4, a P-type epitaxial growth layer PEL is formed on P-type semiconductor substrate SUB while an N-type buried region NBR (the first buried region) and a P-type buried region PBR (the second buried region) are interposed therebetween. The impurity concentration of the P-type buried region is set higher than that of P-type epitaxial growth layer PEL.

Cathode region KR (the first impurity region) is formed to extend from the surface of P-type epitaxial growth layer PEL to a prescribed depth. Cathode region KR is formed so as to extend in one direction. An N-type high concentration region HNR having a relatively high impurity concentration is formed on the surface of cathode region KR. Anode region AR (the second impurity region) is formed at a distance from cathode region KR so as to extend from the surface of P-type epitaxial growth layer PEL to a prescribed depth. Anode region AR is arranged so as to surround cathode region KR.

A P-type high concentration region HPR having a relatively high impurity concentration is formed on the surface of anode region AR.

Furthermore, N-type sinker region NSR (the third impurity region) penetrating P-type epitaxial growth layer PEL to N-type buried region NBR is formed. N-type sinker region NSR is arranged so as to surround anode region AR. N-type high concentration region HNR having a relatively high impurity concentration is formed on the surface of N-type sinker region NSR.

Isolation region STR electrically isolating cathode region KR and anode region AR is formed between cathode region KR and anode region AR. Furthermore, isolation region STR electrically isolating anode region AR and N-type sinker region NSR is formed between anode region AR and N-type sinker region NSR. Isolation region STR is formed by filling a relatively shallow trench STC with an isolation insulating film SIF. This relatively shallow trench STC is formed in the surface of P-type epitaxial growth layer PEL.

Resistance element RE is formed on the surface of isolation region STR electrically isolating anode region AR and N-type sinker region NSR. Resistance element RE is formed to have a width W so as to extend in one direction (the X direction). Resistance element RE has one end portion arranged on the anode region AR side, and the other end portion arranged on the N-type sinker region NSR side.

An isolation region DTR is formed so as to surround the region in which diode FID including cathode region KR and anode region AR is formed. Isolation region DTR is formed by filling a relatively deep trench DTC with an isolation insulating film DIF. This relatively deep trench DTC extends from the surface of P-type epitaxial growth layer PEL so as to penetrate N-type buried region NBR to the region of p-type semiconductor substrate SUB.

An insulating film IF is formed so as to cover diode FID, resistance element RE, and the like. A cathode wire KW, an anode wire AW, a relay wire MW, and a sinker wire SW are formed on the surface of insulating film IF. Cathode wire KW is electrically connected to cathode region KR (N-type high concentration region HNR) through a plug PG. Anode wire AW is electrically connected to each of anode region AR (P-type high concentration region HPR) and the one end portion of resistance element RE through plug PG.

Relay wire MW is electrically connected to the other end portion of resistance element RE through plug PG. Sinker wire SW is electrically connected to N-type sinker region NSR through plug PG. Relay wire MW is electrically connected to the ground potential through an upper wire UW1 that is formed in the layer further above intermediate wire MW and the like. Anode wire AW and sinker wire SW are electrically connected to each other through an upper wire UW2.

Then, the planar structure (pattern) of protection element formation region PAE will be hereinafter described in more detail. As shown in FIG. 3, cathode region KR is formed so as to extend in the Y direction. Anode region AR includes two regions ARR and ARL that face each other at a distance from each other in the X direction so as to sandwich cathode region KR. These two regions ARR and ARL extend in the Y direction. N-type sinker region NSR includes: a region NSRR extending in the Y direction and facing region ARR of anode region AR; and a region NSRL extending in the Y direction and facing region ARL of anode region AR.

Resistance element RE has: a resistance element RER arranged in a portion of the isolation region that electrically isolates region ARR and region NSRR; and a resistance element REL arranged in a portion of the isolation region that electrically isolates region ARL and region NSRL. The semiconductor device including diode FID according to the first example is configured as described above.

Then, an example of the method of manufacturing the semiconductor device set forth above will be hereinafter described. Although an explanation will be hereinafter given for convenience with reference to the protection element formation region having a diode formed therein, this region is to be formed simultaneously with an element, a wire or the like formed in other regions (not shown) in the actual manufacturing process.

Figure 5:
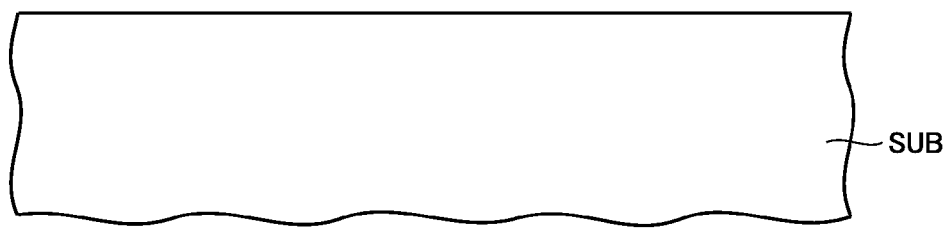
FIG. 5 is a cross-sectional view showing a step of a method of manufacturing the semiconductor device according to the first embodiment.
Figure 6:
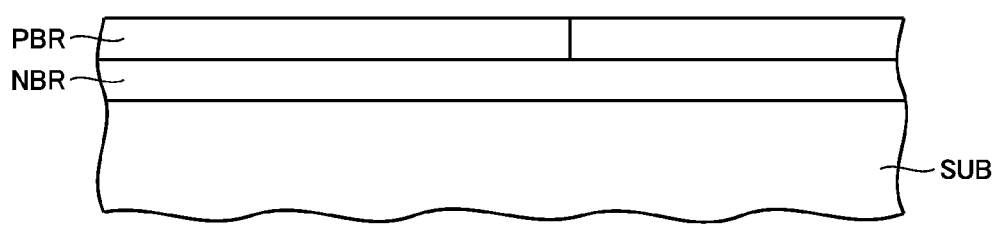
FIG. 6 is a cross-sectional view showing a step carried out after the step shown in FIG. 5 according to the first embodiment.

First, P-type semiconductor substrate SUB is prepared as shown in FIG. 5. Then, N-type impurities are injected into a prescribed region in semiconductor substrate SUB, thereby forming N-type buried region NBR, as shown in FIG. 6. Furthermore, P-type impurities are injected into a prescribed region in semiconductor substrate SUB, thereby forming P-type buried region PBR.

Figure 7:
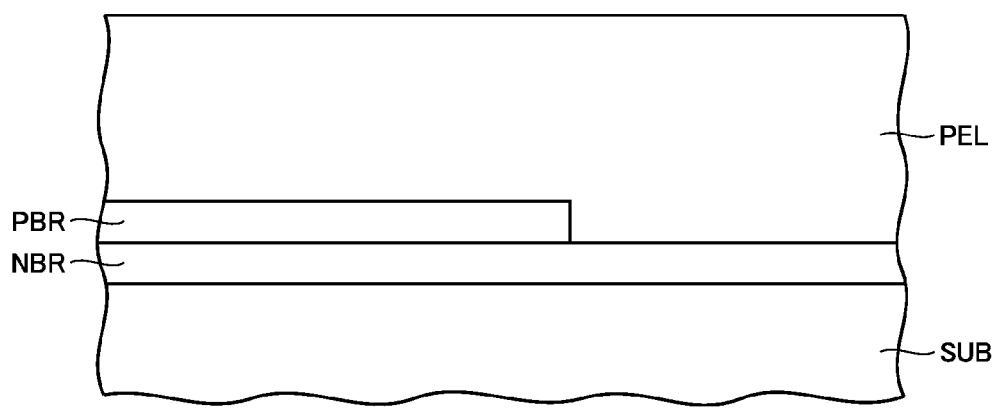
FIG. 7 is a cross-sectional view showing a step carried out after the step shown in FIG. 6 according to the first embodiment.
Figure 8:
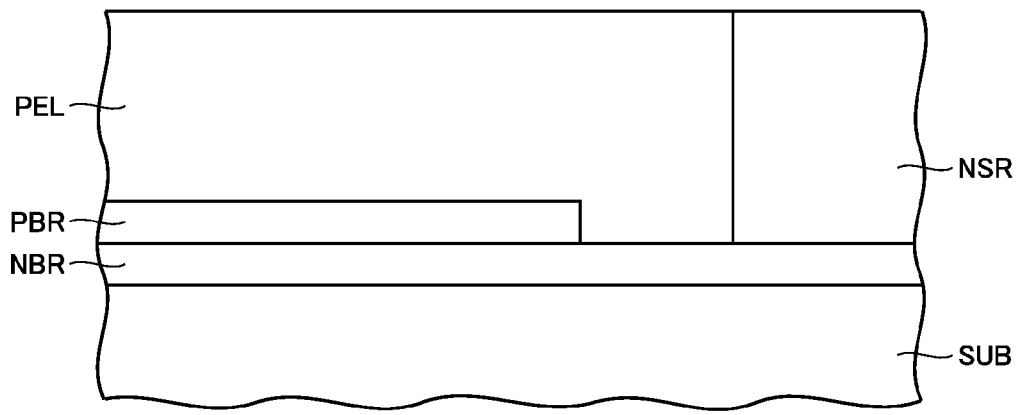
FIG. 8 is a cross-sectional view showing a step carried out after the step shown in FIG. 7 according to the first embodiment.

Then, as shown in FIG. 7, P-type epitaxial growth layer PEL is formed by the epitaxial growth method. The impurity concentration of the P-type epitaxial growth layer is set lower than the impurity concentration of P-type buried region PBR. Then, as shown in FIG. 8, N-type impurities are injected into a prescribed region in P-type epitaxial growth layer PEL, thereby forming N-type sinker region NSR extending from the surface of P-type epitaxial growth layer PEL to N-type buried region NBR.

Figure 9:
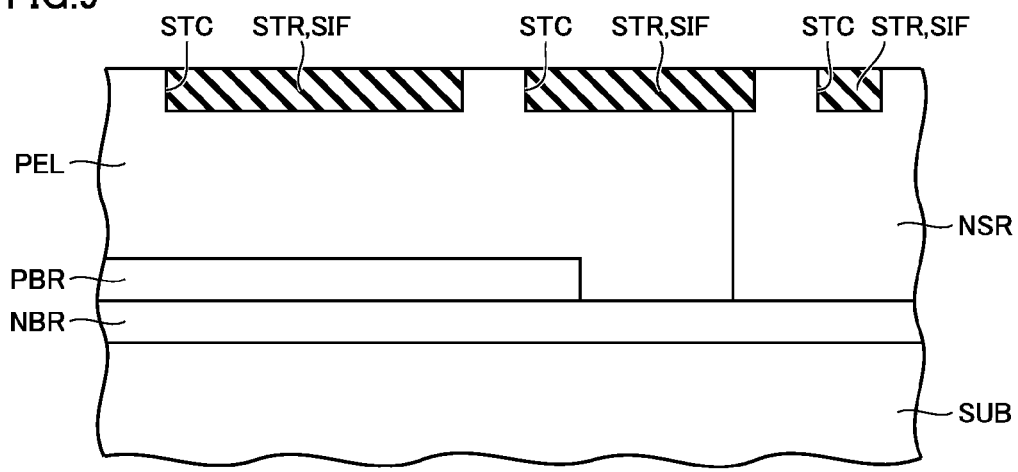
FIG. 9 is a cross-sectional view showing a step carried out after the step shown in FIG. 8 according to the first embodiment.

Then, as shown in FIG. 9, trench STC is formed in a prescribed region in P-type epitaxial growth layer PEL and filled with isolation insulating film SIF, thereby forming isolation region STR.

Figure 10:
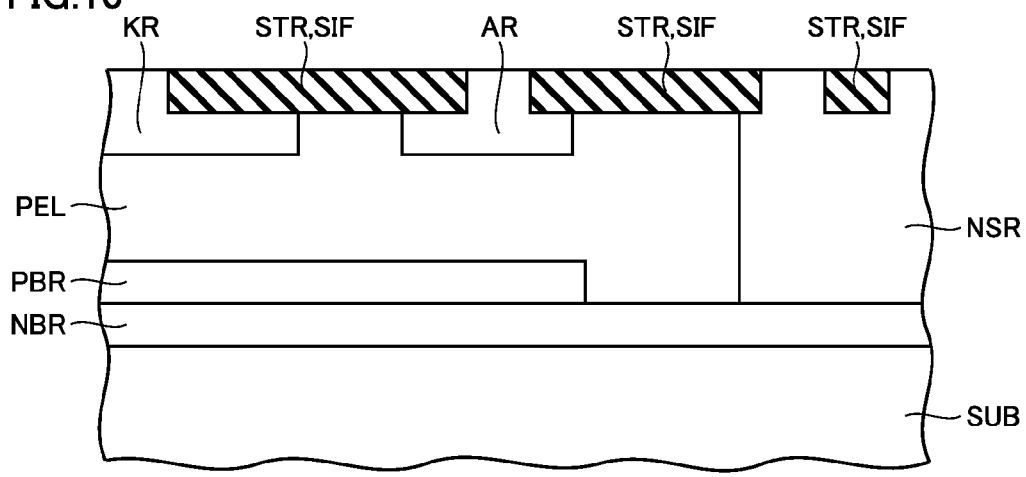
FIG. 10 is a cross-sectional view showing a step carried out after the step shown in FIG. 9 according to the first embodiment.

Then, as shown in FIG. 10, N-type impurities are injected into a prescribed region in P-type epitaxial growth layer PEL, thereby forming cathode region KR extending from the surface of P-type epitaxial growth layer PEL to a prescribed depth. Furthermore, P-type impurities are injected into a prescribed region in P-type epitaxial growth layer PEL, thereby forming anode region AR extending from the surface of P-type epitaxial growth layer PEL to a prescribed depth. Anode region AR is formed so as to surround cathode region KR. Furthermore, N-type sinker region NSR is located so as to surround anode region AR (see FIG. 3).

Figure 11:
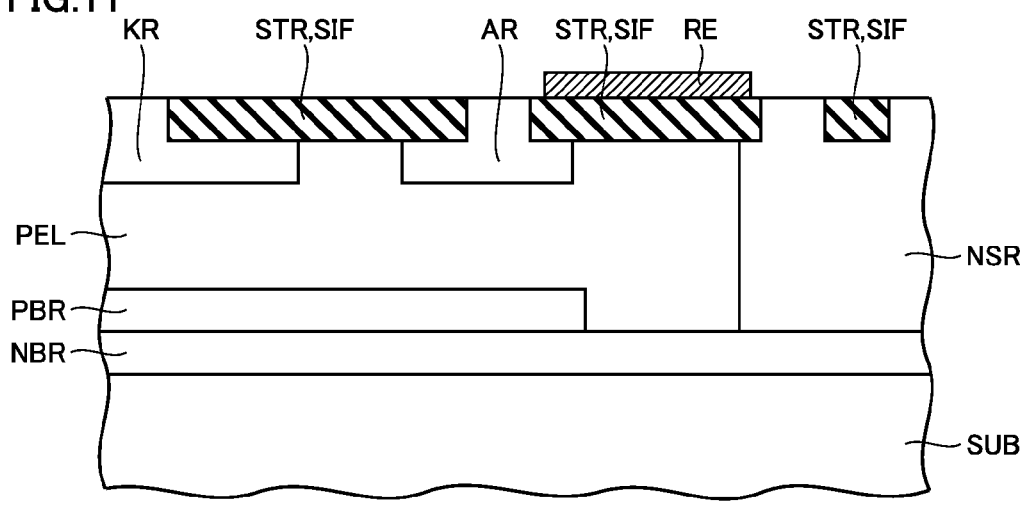
FIG. 11 is a cross-sectional view showing a step carried out after the step shown in FIG. 10 according to the first embodiment.

Then, a polysilicon film (not shown) is formed so as to cover isolation region STR and the like. This polysilicon film is subjected to the prescribed photoengraving process and etching process. In this way, as shown in FIG. 11, resistance element RE is formed on the surface of isolation region STR electrically isolating anode region AR and N-type sinker region NSR. Then, as shown in FIG. 12, N-type high concentration region HNR having a relatively high impurity concentration is formed on the surface of each of cathode region KR and N-type sinker region NSR. Furthermore, P-type high concentration region HPR having a relatively high impurity concentration is formed on the surface of anode region AR.

Figure 14:
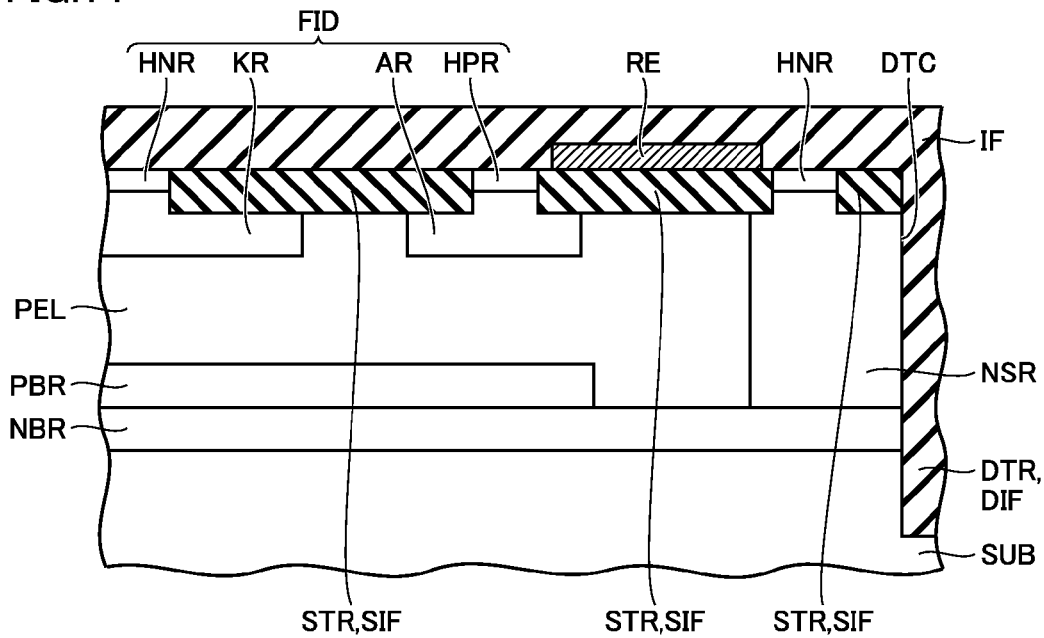
FIG. 14 is a cross-sectional view showing a step carried out after the step shown in FIG. 13 according to the first embodiment.

Then, the prescribed photoengraving process and etching process are carried out. Accordingly, as show in FIG. 13, a deep trench DTC is formed so as to extend from the surface of N-type sinker region NSR (isolation region STR) and penetrate N-type buried region NBR to a P-type region of semiconductor substrate SUB. Then, as shown in FIG. 14, insulating film IF is formed so as to fill trench DTC and also cover resistance element RE and the like. The portion of insulating film IF that fills trench DTC serves as isolation insulating film DIF. In addition, the insulating film that fills trench DTC and the insulating film that covers resistance element RE and the like may be separately formed.

Figure 15:
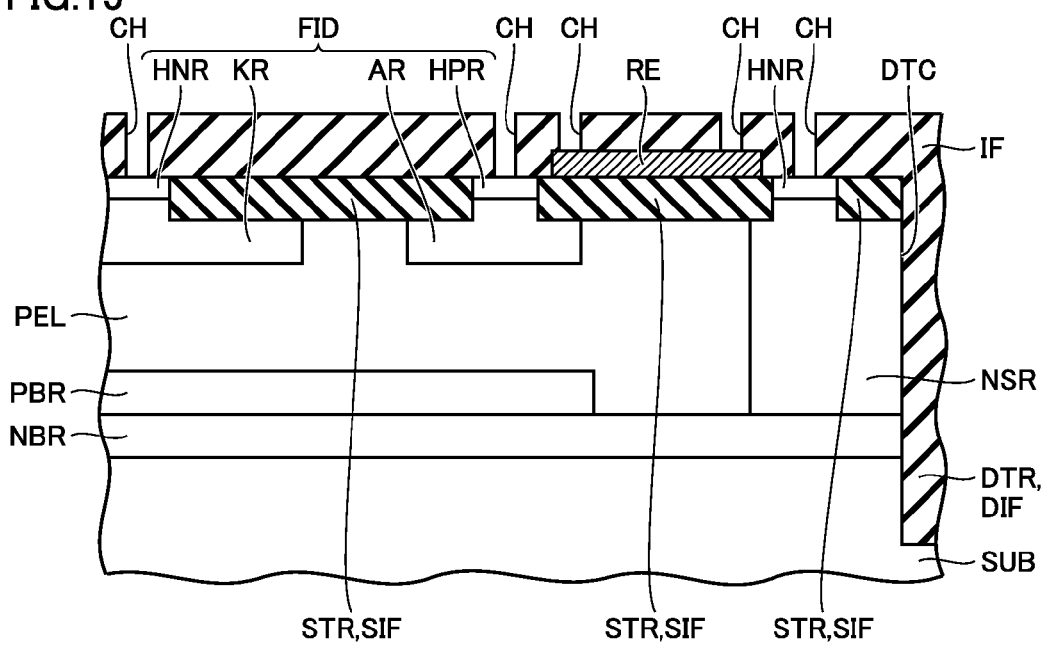
FIG. 15 is a cross-sectional view showing a step carried out after the step shown in FIG. 14 according to the first embodiment.
Figure 16:
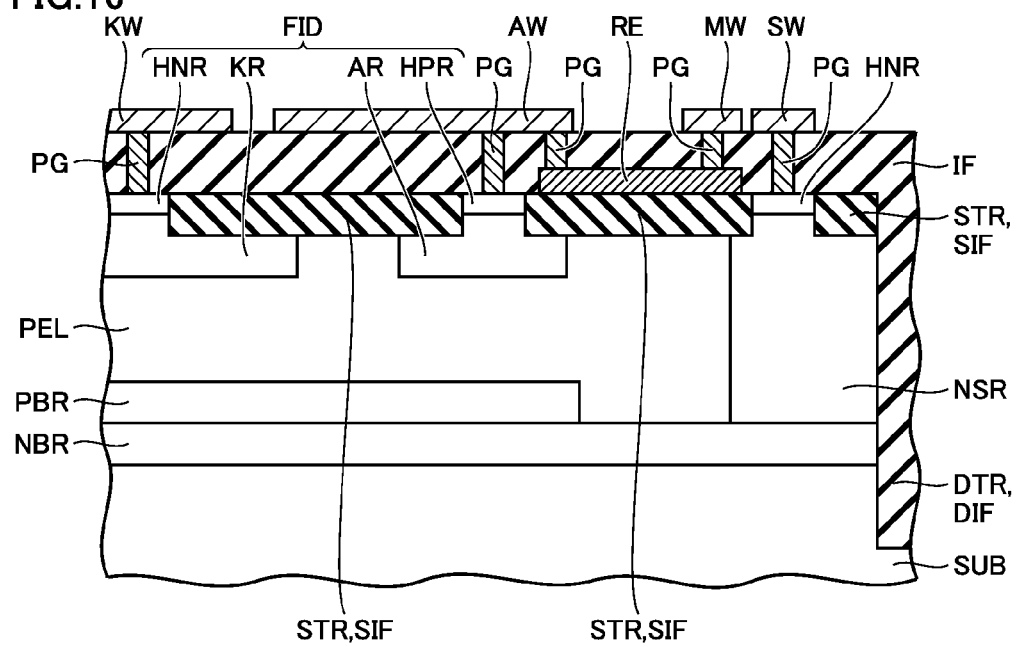
FIG. 16 is a cross-sectional view showing a step carried out after the step shown in FIG. 15 according to the first embodiment.

Then, insulating film IF is subjected to the prescribed photoengraving process and etching process, thereby providing a contact hole CH through which each of N-type high concentration region HNR, P-type high concentration region HPR, and resistance element RE is exposed, as shown in FIG. 15. Then, a conductive film is formed in each contact hole CH, thereby forming plug PG, as shown in FIG. 16. Then, a conductive film (not shown) is formed so as to cover insulating film IF. This conductive film is subjected to the prescribed photoengraving process and etching process, thereby forming cathode wire KW, anode wire AW, sinker wire SW, and relay wire MW.

Cathode wire KW is electrically connected to cathode region KR through plug PG. Anode wire AW is electrically connected to anode region AR through plug PG. Furthermore, anode wire AW is electrically connected to the one end portion side of resistance element RE through plug PG. Relay wire MW is electrically connected to the other end portion side of the resistance element through plug PG. Sinker wire SW is electrically connected to N-type sinker region NSR through plug PG. Anode wire AW is formed so as to surround cathode wire KW. Furthermore, sinker wire SW is formed so as to surround anode wire AW.

Then, upper wires UW1 and UW2 are further formed in the layer above anode wire AW, sinker wire SW and relay wire MW. Anode wire AW and sinker wire SW are electrically connected to each other via upper wire UW2. Furthermore, relay wire MW is electrically connected to the ground potential via upper wire UW1. In this way, the main part of the semiconductor device is formed.

In the semiconductor device including diode FID as described above, resistance element RE is arranged in isolation region STR located in protection element formation region PAE, which can contribute to size reduction of the semiconductor device while suppressing destruction of diode FID. This will be hereinafter described by comparison with the semiconductor device according to a comparative example.

Figure 17:
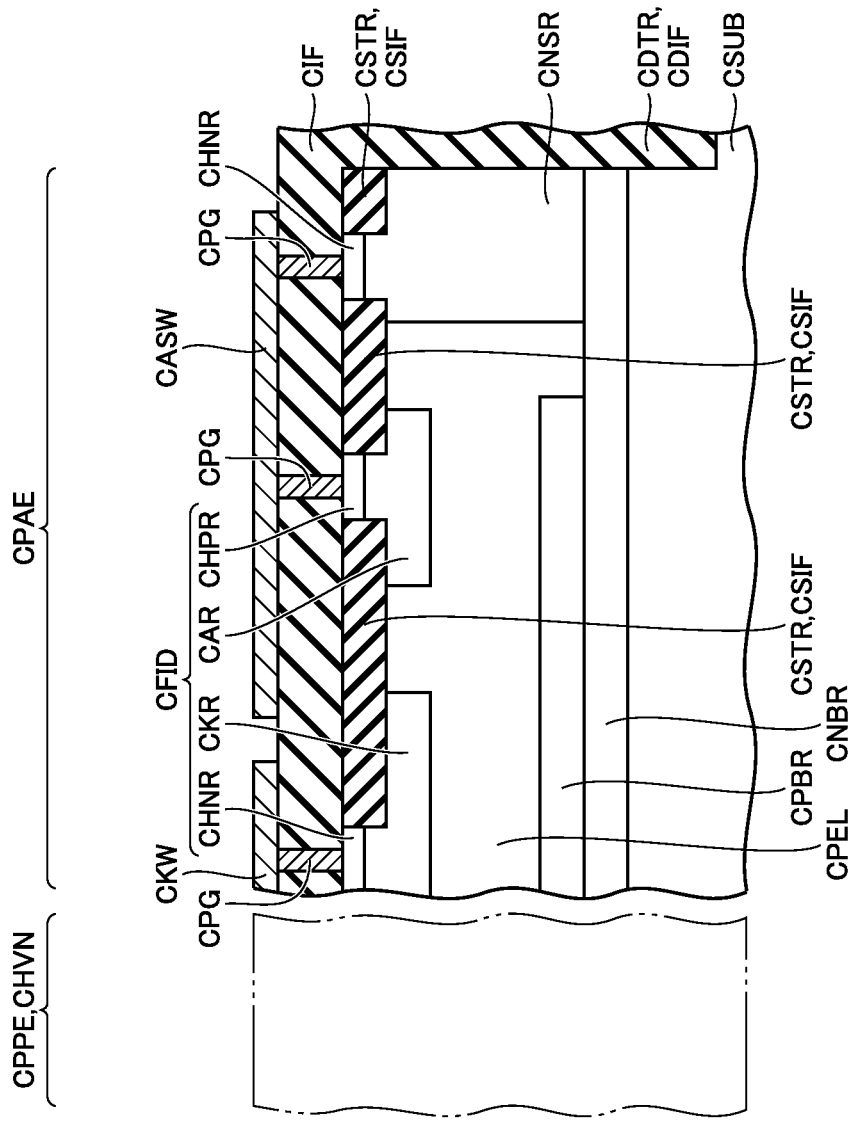
FIG. 17 is a cross-sectional view of a semiconductor device according to the first comparative example.

First, the reason why a resistance element is arranged will be hereinafter described with reference to the semiconductor device not including a resistance element. As shown in FIG. 17, a protected element formation region CPPE and a protection element formation region CPAE are defined in a semiconductor substrate CSUB so as to be adjacent to each other. For example, a high breakdown voltage N channel type MOS transistor CHVN is formed in protected element formation region CPPE. A diode CFID is formed in protection element formation region CPAE.

A P-type epitaxial growth layer CPEL is formed on P-type semiconductor substrate CSUB while an N-type buried region CNBR and a P-type buried region CPBR are interposed therebetween. A cathode region CKR is formed so as to extend from the surface of P-type epitaxial growth layer CPEL to a prescribed depth. An N-type high concentration region CHNR having a relatively high impurity concentration is formed on the surface of cathode region CKR.

An anode region CAR is formed at a distance from cathode region CKR so as to extend from the surface of P-type epitaxial growth layer CPEL to a prescribed depth. A P-type high concentration region CHPR having a relatively high impurity concentration is formed on the surface of anode region CAR. An N-type sinker region CNSR is formed that penetrates P-type epitaxial growth layer CPEL to N-type buried region CNBR. N-type high concentration region CHNR having a relatively high impurity concentration is formed on the surface of N-type sinker region CNSR.

An isolation region CSTR is formed between cathode region CKR and anode region CAR. Furthermore, isolation region CSTR is formed between anode region CAR and N-type sinker region CNSR. Isolation region CSTR is formed by filling a relatively shallow trench with isolation insulating film CSIF. This relatively shallow trench is formed in the surface of P-type epitaxial growth layer CPEL. An isolation region CDTR is formed so as to surround the region having diode CFID formed therein. Isolation region CDTR is formed by filling relatively deep trench CDTC with isolation insulating film CDIF.

An insulating film CIF is formed so as to cover diode CFID and the like. A cathode wire CKW and an anode sinker wire CASW are formed on the surface of insulating film CIF. Cathode wire CKW is electrically connected to cathode region CKR through plug CPG. Anode sinker wire CASW is electrically connected to anode region CAR and N-type sinker region CNSR through plug CPG.

Figure 18:
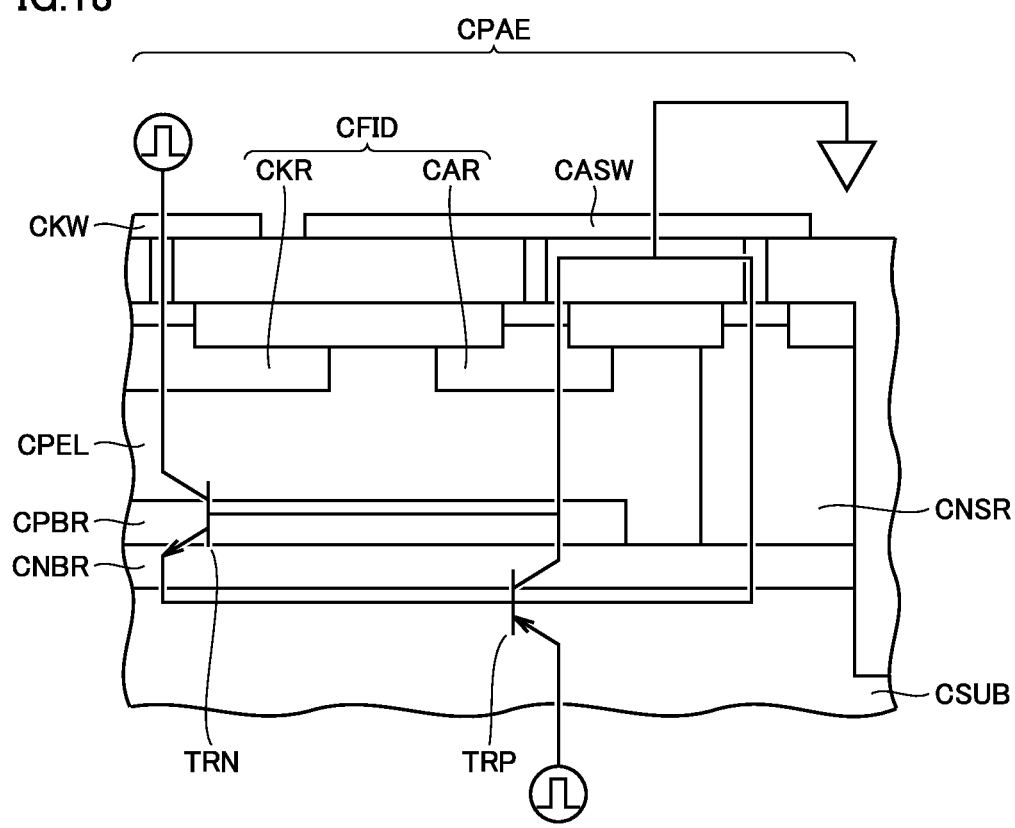
FIG. 18 is a diagram for illustrating problems of the semiconductor device according to the first comparative example.

In such a semiconductor device, a surge, static electricity or the like may cause destruction of diode CFID. As shown in FIG. 18, a current such as a surge flowing into protection element formation region CPAE having diode CFID formed therein includes two elements including: an element (an element A) flowing from the protected element of the protected element formation region toward the semiconductor substrate and also through the semiconductor substrate into protection element formation region CPAE; and an element (an element B) flowing from the surface side of the protected element formation region through cathode wire CKW into protection element formation region CPAE.

When the electric potential of the semiconductor substrate is increased by element A, parasitic PNP transistor TRP is operated to cause a current to flow into anode region CAR. On the other hand, the current caused to flow into cathode region CKR by element B is caused to flow into N-type sinker region CNSR through N-type buried region CNBR by the operation of parasitic NPN transistor TRN. At this time, the current (hole) having flown into anode region CAR flows as a base current of parasitic NPN transistor TRN, and thus, the operation of parasitic NPN transistor TRN is accelerated, so that a large current is to flow from cathode region CKR into N-type sinker region CNSR. This finally results in destruction of diode CFID.

Figure 19:
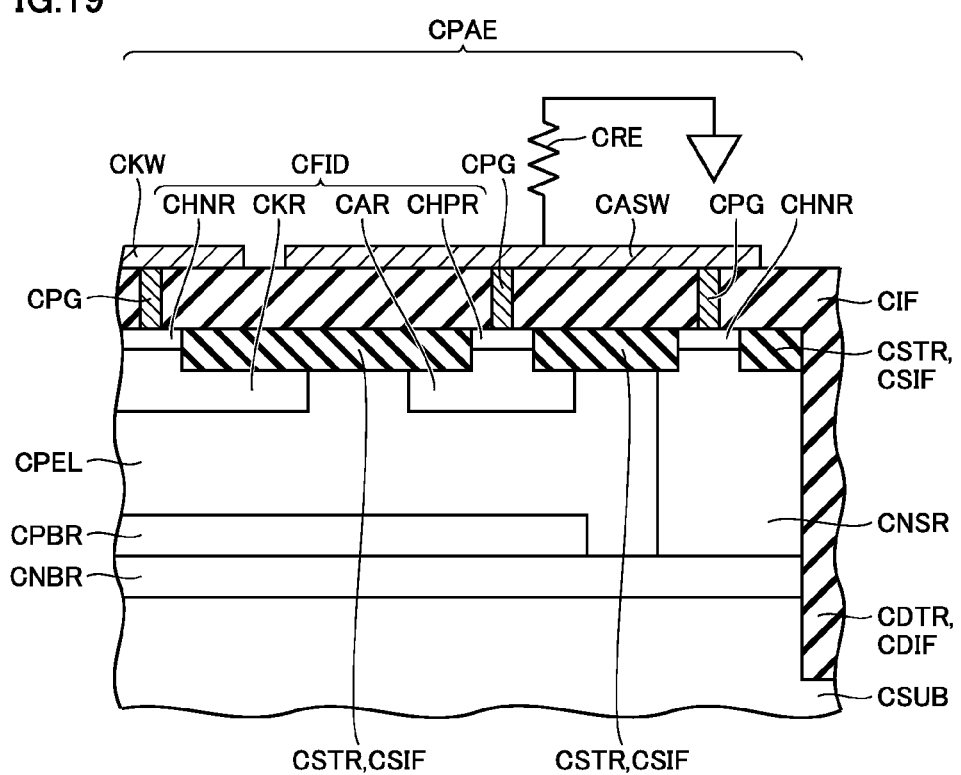
FIG. 19 is a cross-sectional view of a semiconductor device according to the second comparative example.

In order to avoid such destruction of diode CFID, a resistance element CRE is electrically connected between the ground potential and anode sinker wire CASW electrically connected to anode region CAR, as shown in FIG. 19. When resistance element CRE is connected, the potential difference between semiconductor substrate CSUB and anode region CAR can be decreased as compared with the case where no resistance element is provided.

Consequently, the potential difference between P-type buried region CPBR and anode region CAR is also to be decreased. Accordingly, even if the current caused by a surge or the like flows from the semiconductor substrate side, this current is less likely to flow from semiconductor substrate CSUB into anode region CAR, thereby suppressing the operation of parasitic PNP transistor TRP and also suppressing acceleration of the operation of parasitic NPN transistor TRN. Consequently, destruction of diode CFID can be suppressed.

Figure 20:
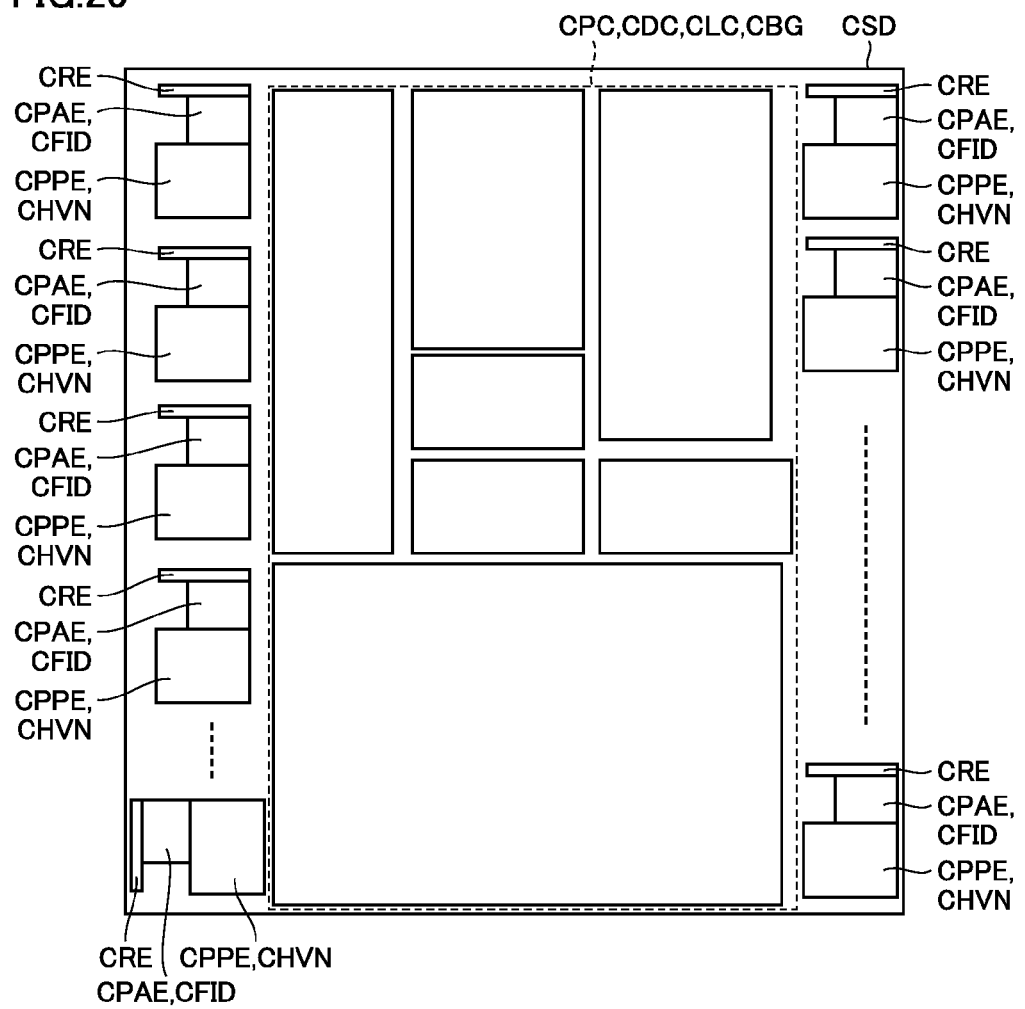
FIG. 20 is a plan view showing a planar layout of the semiconductor device according to the second comparative example.

Meanwhile, the following problems occur in the semiconductor device according to the comparative example. As shown in FIG. 20, in a semiconductor chip CSD according to the comparative example, a power supply circuit CPC, a driver circuit CDC, a logic circuit CLC, a BG circuit CBG, and the like are first arranged so as to occupy most of the portion located approximately in the center area. Protected element formation region CPPE having a high breakdown voltage N channel type MOS transistor CHVN formed therein and protection element formation region CPAE having diode CFID formed therein are arranged so as to be interspersed in the peripheral region of semiconductor chip CSD.

Resistance element CRE is formed in the region adjacent to protection element formation region CPAE. Since resistance element CRE is disposed corresponding to its respective protection element formation region CPAE, semiconductor chip CSD is required to ensure an additional region used for arranging such a resistance element CRE. This is one of factors that prevent size reduction of the semiconductor device.

In contrast to the semiconductor device according to the comparative example, in the semiconductor device according to the first embodiment, resistance element RE is formed on the surface of isolation region STR located in protection element formation region PAE, as shown in FIGS. 1 to 4. This eliminates the need to ensure an additional region that is used for arranging resistance element RE in a region different from protection element formation region PAE, which can consequently contribute to size reduction of the semiconductor device.

Figure 21:
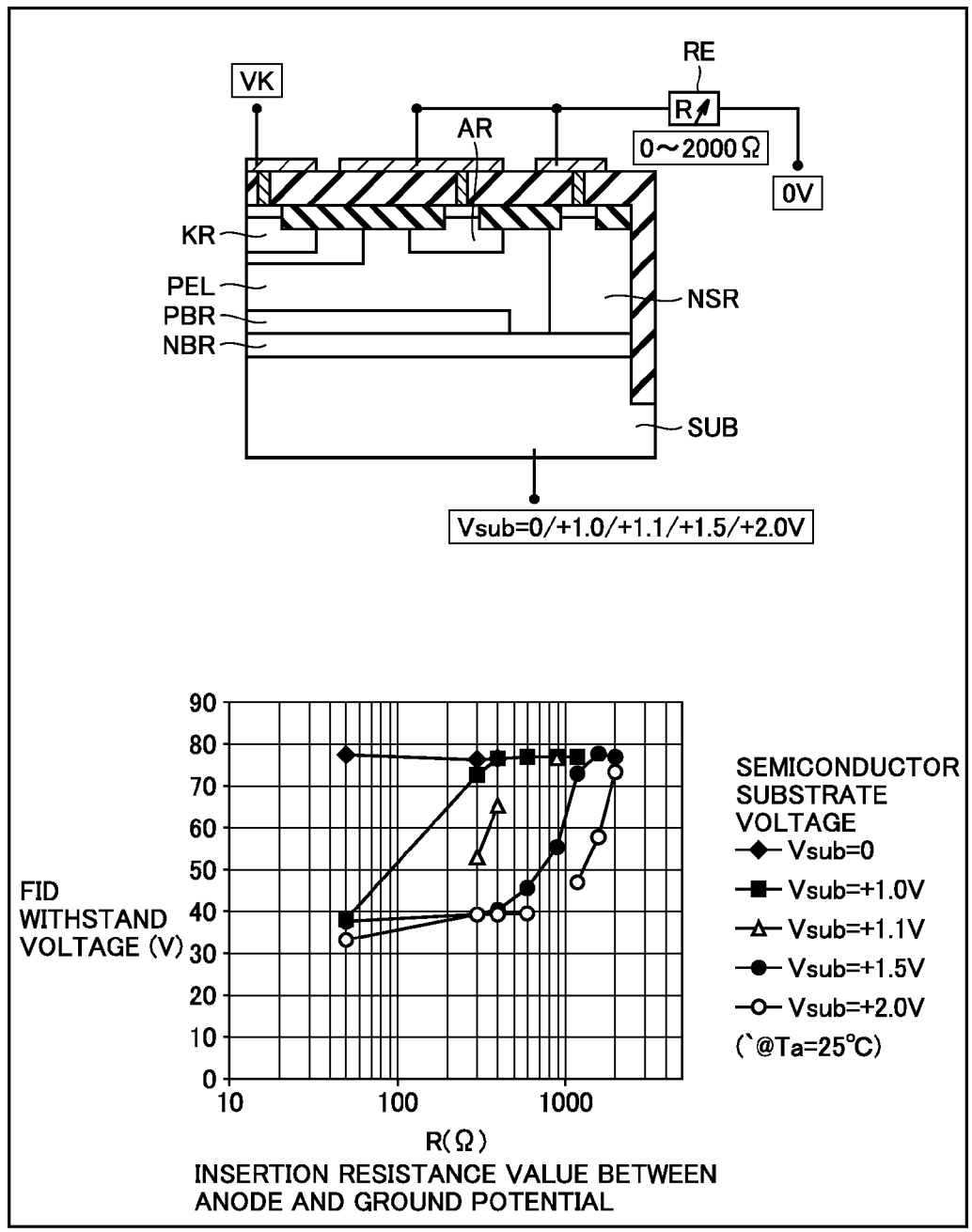
FIG. 21 illustrates a method for evaluating the relation between a resistance value and a breakdown voltage of a diode, and the results thereof according to the first embodiment.

Then, the resistance value of resistance element RE will be hereinafter described. The inventors evaluated the relation between the resistance value of the resistance element electrically connected to the anode region and the breakdown voltage of the diode while changing a voltage to be applied to a P-type semiconductor substrate. As shown in FIG. 21 (the figure on the upper side), the resistance value of the resistance element was changed in a range of 0Ω to 2000Ω. Also, the voltage to be applied to the semiconductor substrate was set at 0V, +1V, +1.1V, +1.5V, and +2.0V. The resulting graph is shown in the figure (the figure on the lower side).

The graph shows that, when a voltage is applied to the semiconductor substrate, the breakdown voltage of the diode is improved as the resistance value of the resistance element is increased. This evaluation result shows that, when a resistance element having a resistance value of at least 2000Ω (2 kΩ or higher) is connected, it becomes possible to suppress a decrease in the breakdown voltage of the diode in the state where a voltage of +2.0V is applied to the semiconductor substrate.

Figure 22:
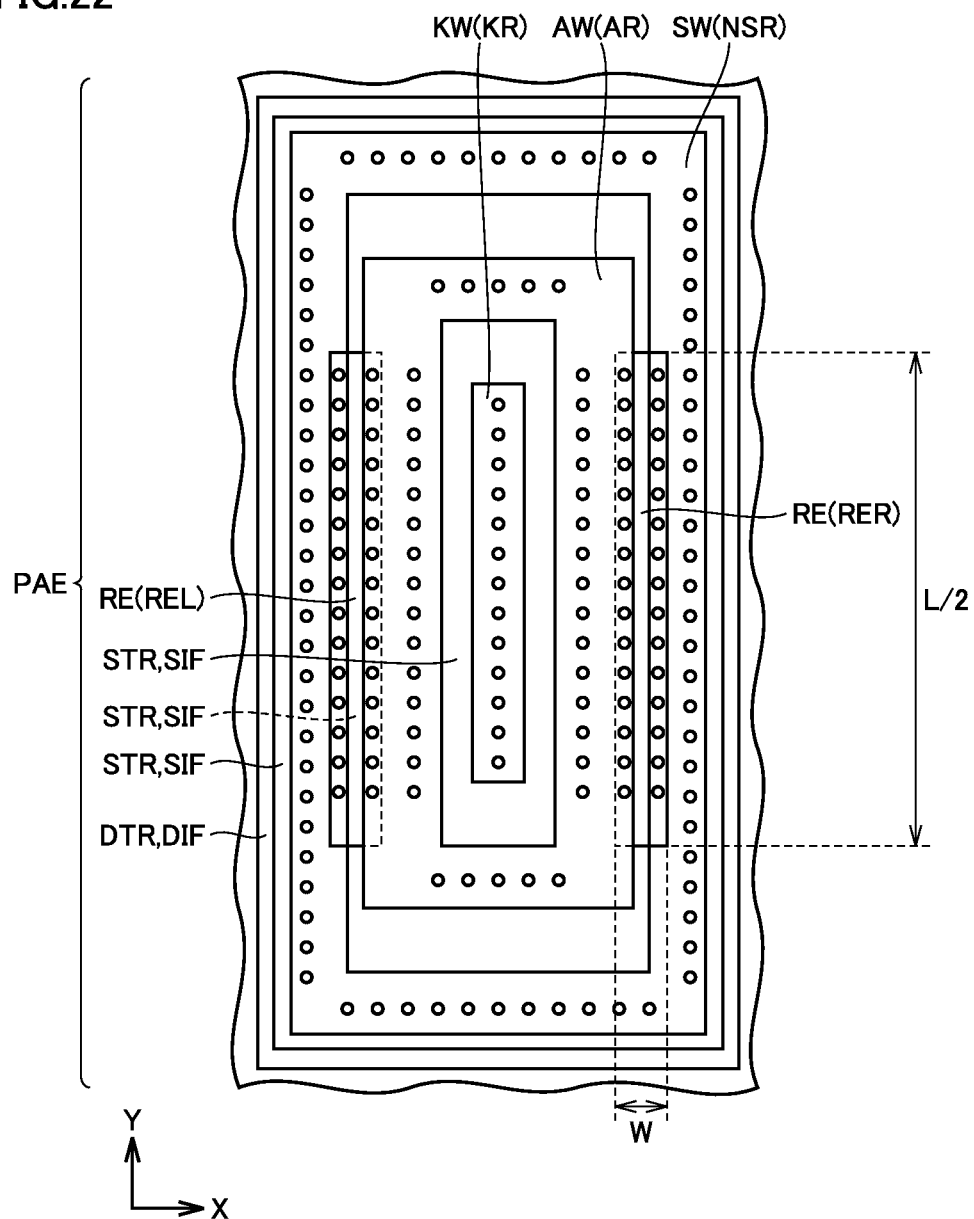
FIG. 22 is a plan view for illustrating dimensions of a resistance element according to the first embodiment.

In the semiconductor device according to the embodiment, the resistance element having a desired size shown in FIG. 22 is set based on the above-described findings. In this case, assuming that the sheet resistance value is defined as Rs, the width is defined as W and the length is defined as L, a resistance value Rr is expressed by the following equation.

$$Rr = L/W \times Rs$$

It is to be noted that the length of each of resistance element RER and resistance element REL is set at a length that is half of length L (L/2).

Second Embodiment

The second example of the semiconductor device including a diode that protects a protected element such as a high breakdown voltage element will be hereinafter described.

Figure 23:
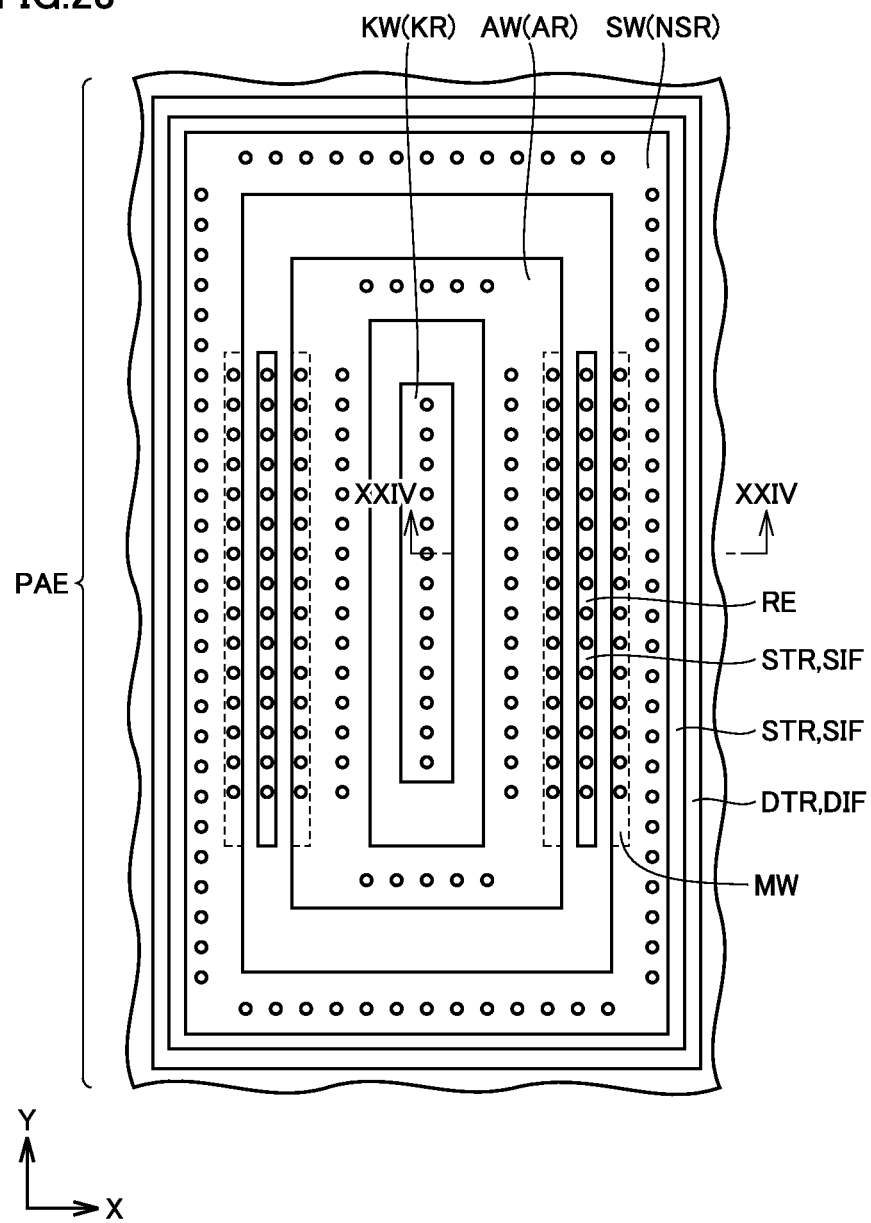
FIG. 23 is a plan view showing a planar structure of a protection element formation region in a semiconductor device according to the second embodiment.
Figure 24:
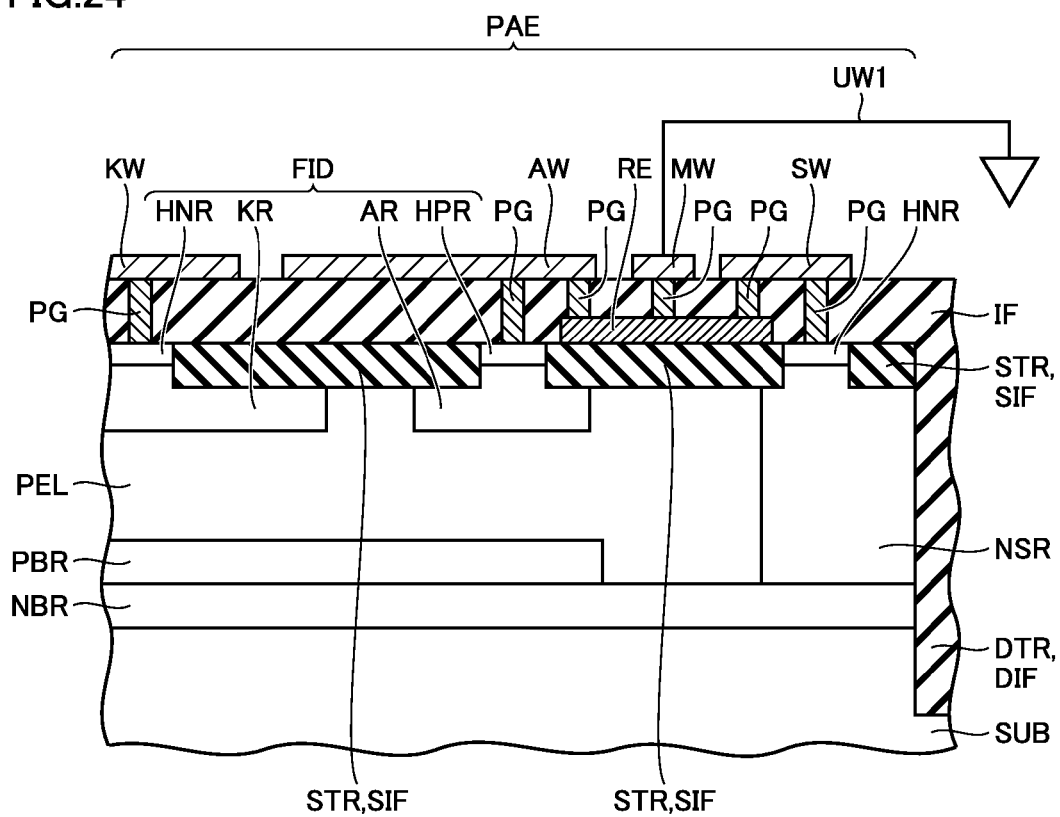
FIG. 24 is a cross-sectional view taken along a section line XXIV-XXIV shown in FIG. 23 according to the second embodiment.

As shown in FIGS. 23 and 24, resistance element RE is formed on the surface of isolation region STR electrically isolating anode region AR and N-type sinker region NSR. Resistance element RE has one end portion arranged on the anode region AR side, and the other end portion arranged on the N-type sinker region NSR side.

Insulating film IF is formed so as to cover resistance element RE and the like. Cathode wire KW, anode wire AW, relay wire MW, and sinker wire SW are formed on the surface of insulating film IF. Cathode wire KW is electrically connected to cathode region KR (N-type high concentration region HNR) through plug PG. Anode wire AW is electrically connected to anode region AR (P-type high concentration region HPR) and the one end portion of resistance element RE through plug PG.

Sinker wire SW is electrically connected to N-type sinker region NSR through plug PG. Relay wire MW is electrically connected through plug PG to an intermediate portion between the one end portion and the other end portion of resistance element RE. Relay wire MW is electrically connected to the ground potential through upper wire UW1 formed in the layer further above relay wire MW.

In resistance element RE, the resistance value between the other end portion of resistance element RE electrically connected to N-type sinker region NSR and the intermediate portion of resistance element RE having relay wire MW electrically connected thereto is set at 2000Ω (2 kΩ) or higher, as having been described in the first embodiment. Since the configuration other than the above is the same as that of the semiconductor device shown in FIGS. 3 and 4, the same components are designated by the same reference characters, and description thereof will not be repeated unless otherwise required.

The above-described semiconductor device is formed by the manufacturing method that is substantially the same as the manufacturing method having been described in the first embodiment except that the patterns of plug PG, sinker wire SW and upper wire UW1 are different.

In the above-described semiconductor device, resistance element RE preventing destruction of diode FID is formed on the surface of isolation region STR that is located in protection element formation region PAE. Thereby, there is no need to ensure a region used for arranging a resistance element in a region different from protection element formation region PAE, unlike the semiconductor device according to the comparative example having been described in the first embodiment. This can consequently contribute to size reduction of the semiconductor device.

Furthermore, in the above-described semiconductor device, anode region AR is electrically connected to the one end portion of resistance element RE through anode wire AW, and N-type sinker region NSR is electrically connected to the other end portion of resistance element RE through sinker wire SW. Thereby, anode region AR and N-type sinker region NSR can be electrically connected to each other without through the upper wire, so that anode region AR and N-type sinker region NSR can be readily electrically connected to each other.

Third Embodiment

The third example of the semiconductor device including a diode that protects a protected element such as a high breakdown voltage element will be hereinafter described.

Figure 25:
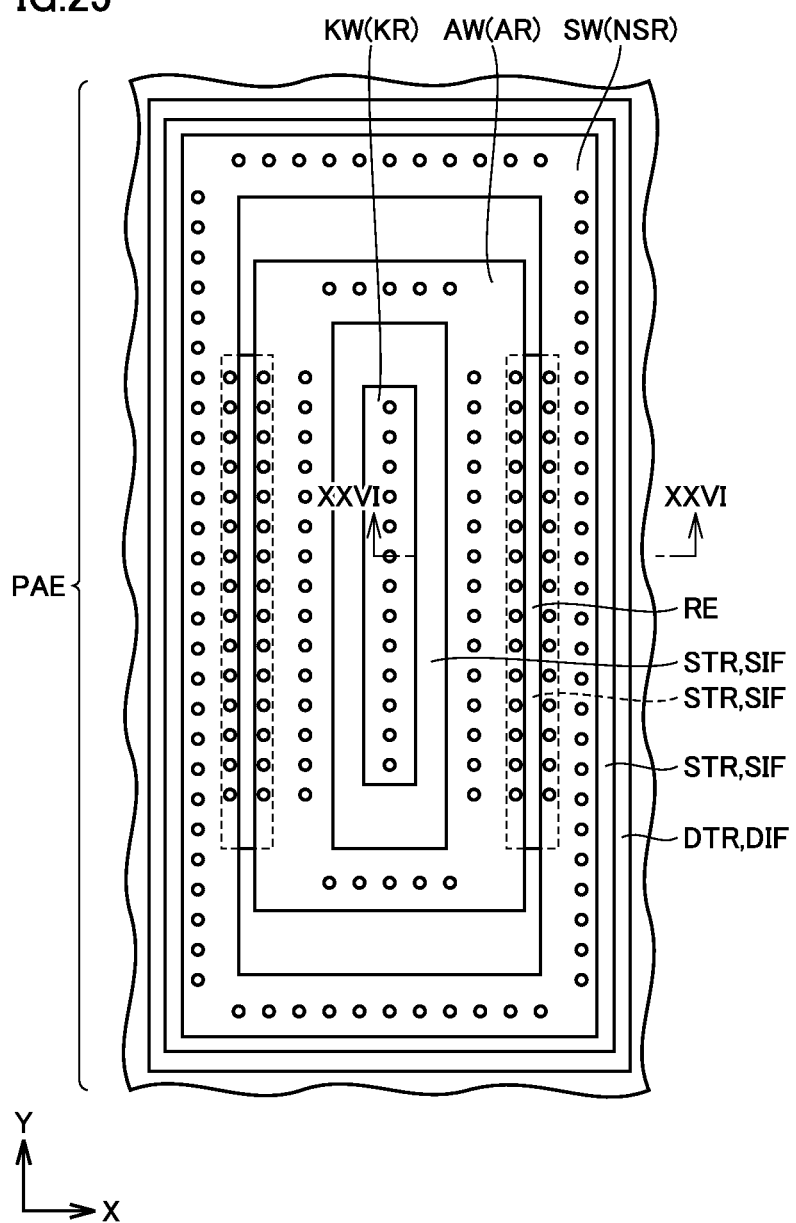
FIG. 25 is a plan view showing a planar structure of a protection element formation region in a semiconductor device according to the third embodiment.
Figure 26:
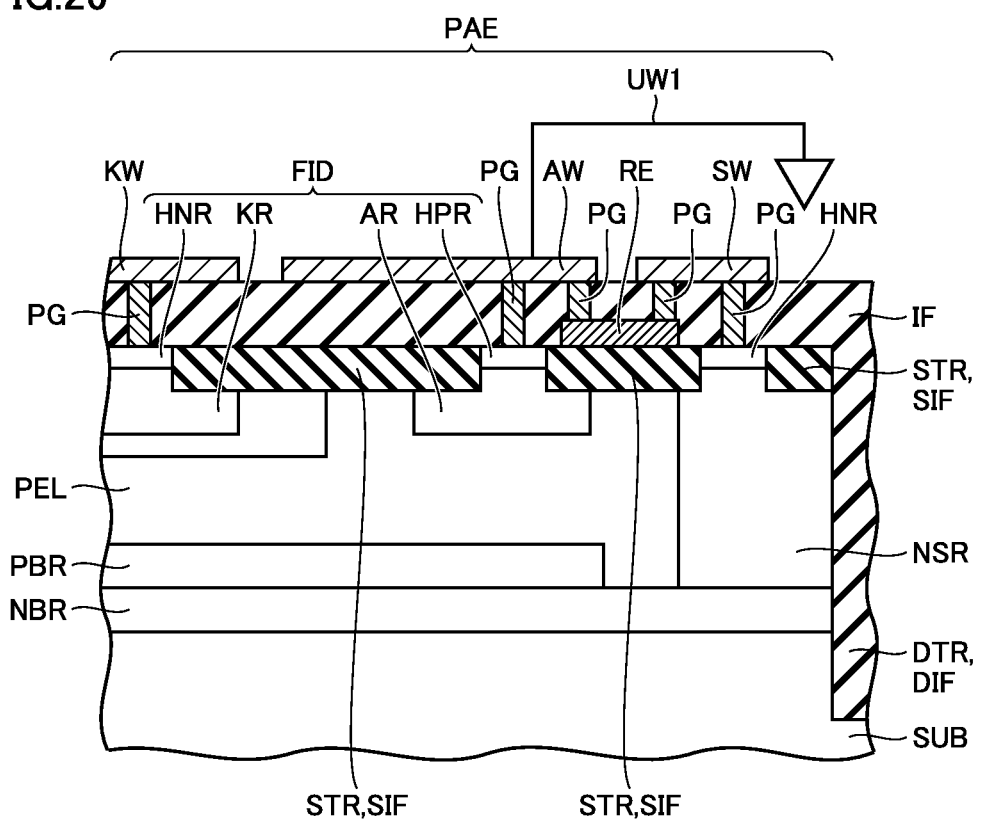
FIG. 26 is a cross-sectional view taken along a section line XXVI-XXVI shown in FIG. 25 according to the third embodiment.

As shown in FIGS. 25 and 26, resistance element RE is formed on the surface of isolation region STR electrically isolating anode region AR and N-type sinker region NSR. Resistance element RE has one end portion arranged on the anode region AR side and the other end portion arranged on the N-type sinker region NSR side. The resistance value of resistance element RE is set at 2000Ω or higher as having been described in the first embodiment.

Insulating film IF is formed so as to cover this resistance element RE and the like. Cathode wire KW, anode wire AW and sinker wire SW are formed on the surface of insulating film IF. Cathode wire KW is electrically connected to cathode region KR (N-type high concentration region HNR) through plug PG. Anode wire AW is electrically connected to anode region AR (P-type high concentration region HPR) and the one end portion of resistance element RE through plug PG.

Sinker wire SW is electrically connected to N-type sinker region NSR and the other end portion of resistance element RE through plug PG. Anode wire AW is electrically connected to the ground potential through upper wire UW1 formed in the layer further above anode wire AW. Since the configuration other than the above is the same as that of the semiconductor device shown in FIGS. 3 and 4, the same components are designated by the same reference characters, and description thereof will not be repeated unless otherwise required.

The above-described semiconductor device is formed by the manufacturing method that is substantially the same as the manufacturing method having been described in the first embodiment except that the patterns of sinker wire SW and the upper wire are different.

In the above-described semiconductor device, resistance element RE that prevents destruction of diode FID is formed on the surface of isolation region STR located in protection element formation region PAE. Thereby, there is no need to ensure a region used for arranging a resistance element in a region different from protection element formation region PAE, unlike the semiconductor device according to the comparative example having been described in the first embodiment. This can consequently contribute to size reduction of the semiconductor device.

Furthermore, in resistance element RE of the semiconductor device described above, resistance element RE has: one end portion to which the ground potential is electrically connected; and the other end portion to which N-type sinker region NSR is electrically connected. Accordingly, as compared with the case where the ground potential is electrically connected to the intermediate portion of resistance element RE and N-type sinker region NSR is electrically connected to the other end portion thereof, the resistance value can be set at a higher value if the size (area) of the region having resistance element RE arranged therein is the same. On the other hand, if the resistance value of resistance element RE is set at the same resistance value, the region where resistance element RE is arranged can be further reduced in size, which can further contribute to size reduction of the semiconductor device.

In the above-described semiconductor device, anode region AR of diode FID is electrically connected to the ground potential. Accordingly, an upper limit value needs to be set for the resistance value of resistance element RE, which will be described below.

As having been described in the first embodiment, the potential difference between semiconductor substrate SUB and anode region AR needs to be reduced in order to avoid destruction of diode FID. For this reason, resistance element RE is electrically connected between N-type sinker region NSR and the ground potential.

When the resistance value of this resistance element RE is increased, the potential difference between anode region AR and N-type sinker region NSR is increased. Thus, it is feared that a junction leakage current may occur. According to the inventors' evaluation, it is desirable that the resistance value of resistance element RE is 50000Ω or less. Consequently, it turned out that the resistance value of resistance element RE is desirably set at 2000Ω (2 kΩ) or higher and 50000Ω (50 kΩ) or lower in the above-described semiconductor device.

(Modification)

Figure 27:
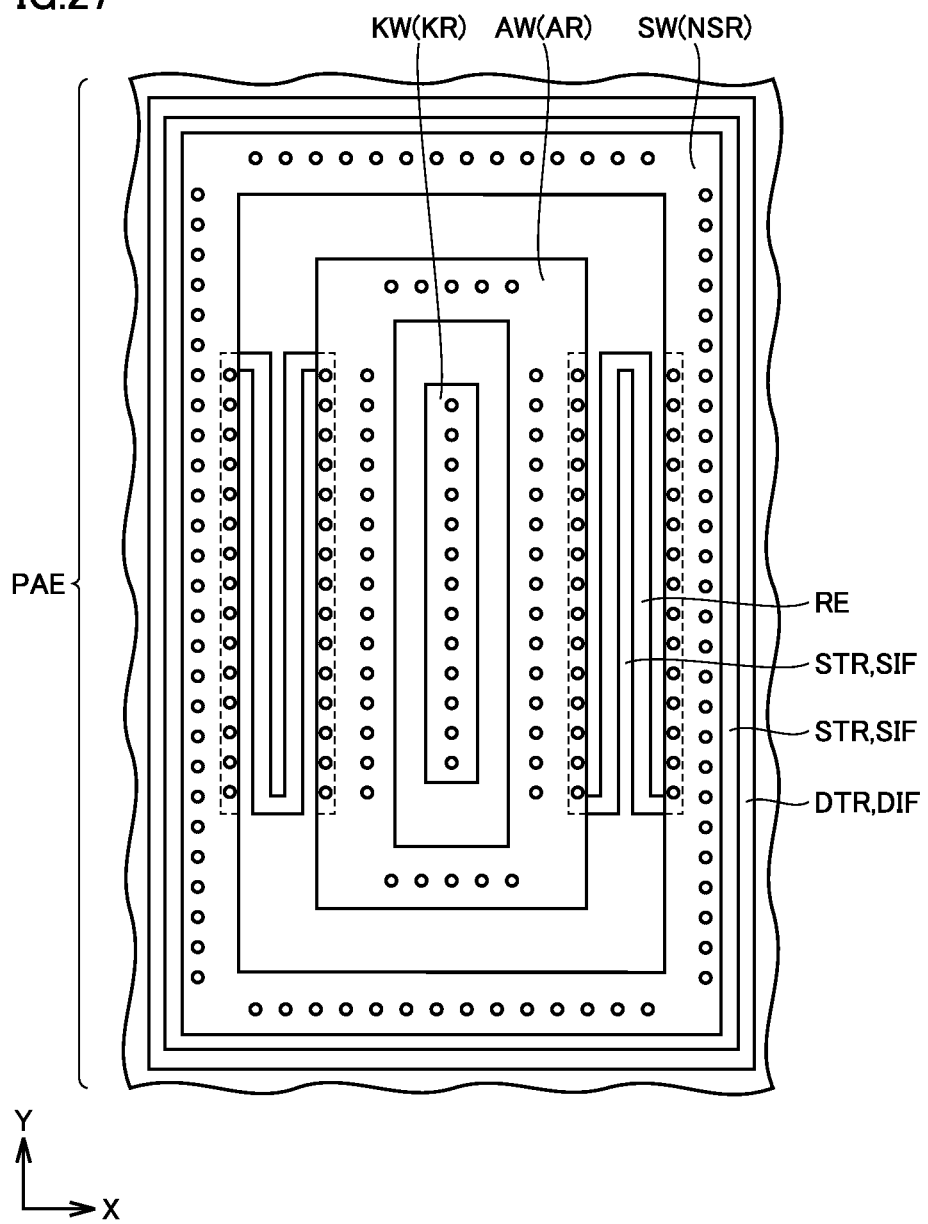
FIG. 27 is a plan view showing a planar pattern of a resistance element according to a modification of each embodiment.

In the semiconductor device according to each of the above-described embodiments, a rectangular pattern (length L/2, width W) has been described as an example of the pattern of resistance element RE, but the pattern of resistance element RE is not limited to such a rectangular pattern. For example, as shown in FIG. 27, resistance element RE having a meandering pattern may be employed.

It is to be noted that the configurations of the semiconductor devices having been described in the above embodiments may be appropriately combined as required. Furthermore, a resistance element formed of a polysilicon film has been mentioned as an example of the resistance element, but the material of the resistance element is not limited to a polysilicon film as long as it can control the resistance value. Furthermore, a high breakdown voltage N channel type MOS transistor has been mentioned as an example of the protected element, the protected element is not limited thereto.

Although the invention made by the present inventors have been specifically described above based on the embodiments, it goes without saying that the present invention is not limited to these embodiments, but can be variously modified without departing from the scope of the features.

What is claimed is:
1. A semiconductor device comprising:
a semiconductor substrate of a first conductivity type;
an epitaxial growth layer of the first conductivity type formed so as to cover said semiconductor substrate;
a first buried region of a second conductivity type formed between said semiconductor substrate and said epitaxial growth layer;
a second buried region of the first conductivity type formed between said first buried region and said epitaxial growth layer;
a first impurity region of the second conductivity type formed so as to extend from a surface of said epitaxial growth layer to a first depth;
a second impurity region of the first conductivity type formed at a distance from said first impurity region so as to extend from the surface of said epitaxial growth layer to a second depth;
a third impurity region of the second conductivity type formed at a distance from said second impurity region so as to extend from the surface of said epitaxial growth layer to said first buried region; and
an isolation region electrically isolating said second impurity region and said third impurity region, and formed in a portion of said epitaxial growth layer,
said third impurity region being electrically connected to a ground potential through a resistance element, and
said resistance element being formed on said isolation region.

2. The semiconductor device according to claim 1, wherein
said resistance element includes one end portion and the other end portion,
said one end portion is disposed on a side of said second impurity region, said other end portion is disposed on a side of said third impurity region, said third impurity region and said second impurity region are electrically connected to said one end portion, and said ground potential is electrically connected to said other end portion.

3. The semiconductor device according to claim 2, wherein a resistance value of said resistance element is set at 2000Ω or higher.

4. The semiconductor device according to claim 1, wherein said resistance element includes one end portion and the other end portion, and an intermediate portion located between said one end portion and said other end portion, said one end portion is disposed on a side of said second impurity region, said other end portion is disposed on a side of said third impurity region, said second impurity region is electrically connected to said one end portion, said third impurity region is electrically connected to said other end portion, and said ground potential is electrically connected to said intermediate portion.

5. The semiconductor device according to claim 4, wherein a resistance value of said resistance element is set at 2000Ω or higher.

6. The semiconductor device according to claim 5, wherein said resistance element is formed of a polysilicon film.

7. The semiconductor device according to claim 1, wherein said resistance element includes one end portion and the other end portion, said one end portion is disposed on a side of said second impurity region, said other end portion is disposed on a side of said third impurity region, said second impurity region and said ground potential are electrically connected to said one end portion, and said third impurity region is electrically connected to said other end portion.

8. The semiconductor device according to claim 7, wherein a resistance value of said resistance element is set at 2000Ω or higher and 50000Ω or lower.

9. The semiconductor device according to claim 8, wherein said resistance element is formed of a polysilicon film.

10. A semiconductor device comprising:

a semiconductor substrate of a first conductivity type;

an epitaxial growth layer of the first conductivity type formed so as to cover said semiconductor substrate;

a first buried region of a second conductivity type formed between said semiconductor substrate and said epitaxial growth layer;

a second buried region of the first conductivity type formed between said first buried region and said epitaxial growth layer;

a first impurity region of the second conductivity type so as to extend from a surface of said epitaxial growth layer to a first depth;

a second impurity region of the first conductivity type formed to extend from the surface of said epitaxial growth layer to a second depth so as to surround said first impurity region;

a third impurity region of the second conductivity type formed to extend from the surface of said epitaxial growth layer to said first buried region so as to surround said second impurity region; and an isolation region electrically isolating said second impurity region and said third impurity region, and formed along a portion of said epitaxial growth layer, wherein said third impurity region is electrically connected to a ground potential through a resistance element, and said resistance element is formed on said isolation region, said first impurity region is formed so as to extend in one direction, said second impurity region includes a first extension portion and a second extension portion that face each other across said first impurity region and extend in said one direction, said third impurity region includes a third extension portion extending in said one direction and facing said first extension portion of said second impurity region, and a fourth extension portion extending in said one direction and facing said second extension portion of said second impurity region, said isolation region has a first isolation portion including a portion located between said first extension portion and said third extension portion, and a second isolation portion including a portion located between said second extension portion and said fourth extension portion, and said resistance element includes a first resistance portion disposed in said first isolation portion, and a second resistance portion disposed in said second isolation portion.

11. A semiconductor device comprising:

a semiconductor substrate of a first conductivity type;

an epitaxial growth layer of the first conductivity type formed so as to cover said semiconductor substrate;

a first buried region of a second conductivity type formed between said semiconductor substrate and said epitaxial growth layer;

a second buried region of the first conductivity type formed between said first buried region and said epitaxial growth layer;

a first impurity region of the second conductivity type so as to extend from a surface of said epitaxial growth layer to a first depth;

a second impurity region of the first conductivity type formed to extend from the surface of said epitaxial growth layer to a second depth so as to surround said first impurity region;

a third impurity region of the second conductivity type formed to extend from the surface of said epitaxial growth layer to said first buried region so as to surround said second impurity region; and an isolation region electrically isolating said second impurity region and said third impurity region, and formed along a portion of said epitaxial growth layer, wherein said third impurity region is electrically connected to a ground potential through a resistance element, said resistance element is formed on said isolation region, and a planar pattern of said resistance element includes a rectangular pattern.

12. A semiconductor device comprising:

a semiconductor substrate of a first conductivity type;

an epitaxial growth layer of the first conductivity type formed so as to cover said semiconductor substrate;
a first buried region of a second conductivity type formed between said semiconductor substrate and said epitaxial growth layer;
a second buried region of the first conductivity type formed between said first buried region and said epitaxial growth layer;
a first impurity region of the second conductivity type so as to extend from a surface of said epitaxial growth layer to a first depth;
a second impurity region of the first conductivity type formed to extend from the surface of said epitaxial growth layer to a second depth so as to surround said first impurity region;
a third impurity region of the second conductivity type formed to extend from the surface of said epitaxial growth layer to said first buried region so as to surround said second impurity region; and
an isolation region electrically isolating said second impurity region and said third impurity region, and formed along a portion of said epitaxial growth layer, wherein
said third impurity region is electrically connected to a ground potential through a resistance element,
said resistance element is formed on said isolation region, and
a planar pattern of said resistance element includes a meandering pattern.

* * * * *